United States Patent
Lee et al.

(10) Patent No.: US 9,390,002 B1
(45) Date of Patent: Jul. 12, 2016

(54) EFFICIENT BIN LABELING SCHEMES FOR TRACKING CELLS IN SOLID STATE STORAGE DEVICES

(71) Applicant: SK Hynix Inc., Gyeonggi-do (KR)

(72) Inventors: Hsiao-Heng Lee, Mountain View, CA (US); Lingqi Zeng, Turlock, CA (US); Frederick K. H. Lee, Mountain View, CA (US); Jason Bellorado, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 340 days.

(21) Appl. No.: 14/065,258

(22) Filed: Oct. 28, 2013

Related U.S. Application Data

(60) Provisional application No. 61/755,792, filed on Jan. 23, 2013.

(51) Int. Cl.
*G06F 12/00* (2006.01)
*G06F 12/02* (2006.01)
*G11C 16/34* (2006.01)

(52) U.S. Cl.
CPC ........ *G06F 12/0246* (2013.01); *G06F 12/0207* (2013.01); *G11C 16/3431* (2013.01)

(58) Field of Classification Search
CPC ........................ G11C 16/3431; G06F 12/0207
See application file for complete search history.

(56) References Cited

U.S. PATENT DOCUMENTS

| 7,975,192 B2 | 7/2011 | Sommer et al. | |
|---|---|---|---|
| 2013/0229867 A1* | 9/2013 | Tang | G11C 16/26 365/185.2 |

* cited by examiner

*Primary Examiner* — Zachary K Huson
(74) *Attorney, Agent, or Firm* — IP & T Group LLP

(57) ABSTRACT

Information associated with a read to solid state storage is received, including a read number and a read value. The read value is written to a location in a cell and bin map, wherein (1) the location in the cell and bin map corresponds to the read number and (2) the cell and bin map tracks, for each cell in a group of cells, which bin out of a plurality of bins a given cell falls into.

21 Claims, 16 Drawing Sheets

FIG. 13B  No Mirror Constraint  ← 1360

| $x_{A3}$ | $x_{A2}$ | $x_{A1}$ | $x_{C3}$ | $x_{C2}$ | $x_{C1}$ |
|---|---|---|---|---|---|
| Bin 111 | Bin 011 | Bin 001 | Bin 000 | Bin 100 | Bin 110 | Bin 111 |

| $x_{A3}$ | $x_{A2}$ | $x_{A1}$ | $x_{C2}$ | $x_{C3}$ | $x_{C1}$ |
|---|---|---|---|---|---|
| Bin 111 | Bin 011 | Bin 001 | Bin 000 | Bin 010 | Bin 110 | Bin 111 |

| $x_{A2}$ | $x_{A3}$ | $x_{A1}$ | $x_{C3}$ | $x_{C2}$ | $x_{C1}$ |
|---|---|---|---|---|---|
| Bin 111 | Bin 101 | Bin 001 | Bin 000 | Bin 100 | Bin 110 | Bin 111 |

| $x_{A2}$ | $x_{A3}$ | $x_{A1}$ | $x_{C2}$ | $x_{C3}$ | $x_{C1}$ |
|---|---|---|---|---|---|
| Bin 111 | Bin 101 | Bin 001 | Bin 000 | Bin 010 | Bin 110 | Bin 111 |

| $x_{A2}$ | $x_{A3}$ | $x_{A1}$ | $x_{C2}$ | $x_{C1}$ | $x_{C3}$ |
|---|---|---|---|---|---|
| Bin 111 | Bin 101 | Bin 001 | Bin 000 | Bin 010 | Bin 011 | Bin 111 |

| $x_{A2}$ | $x_{A1}$ | $x_{A3}$ | $x_{C2}$ | $x_{C3}$ | $x_{C1}$ |
|---|---|---|---|---|---|
| Bin 111 | Bin 101 | Bin 100 | Bin 000 | Bin 010 | Bin 110 | Bin 111 |

| $x_{A2}$ | $x_{A1}$ | $x_{A3}$ | $x_{C2}$ | $x_{C1}$ | $x_{C3}$ |
|---|---|---|---|---|---|
| Bin 111 | Bin 101 | Bin 100 | Bin 000 | Bin 010 | Bin 011 | Bin 111 |

| $x_{A3}$ | $x_{A1}$ | $x_{A2}$ | $x_{C3}$ | $x_{C1}$ | $x_{C2}$ |
|---|---|---|---|---|---|
| Bin 111 | Bin 011 | Bin 010 | Bin 000 | Bin 100 | Bin 101 | Bin 111 |

| $x_{A3}$ | $x_{A1}$ | $x_{A2}$ | $x_{C1}$ | $x_{C3}$ | $x_{C2}$ |
|---|---|---|---|---|---|
| Bin 111 | Bin 011 | Bin 010 | Bin 000 | Bin 001 | Bin 101 | Bin 111 |

| $x_{A1}$ | $x_{A3}$ | $x_{A2}$ | $x_{C3}$ | $x_{C1}$ | $x_{C2}$ |
|---|---|---|---|---|---|
| Bin 111 | Bin 110 | Bin 010 | Bin 000 | Bin 100 | Bin 101 | Bin 111 |

| $x_{A1}$ | $x_{A3}$ | $x_{A2}$ | $x_{C1}$ | $x_{C3}$ | $x_{C2}$ |
|---|---|---|---|---|---|
| Bin 111 | Bin 110 | Bin 010 | Bin 000 | Bin 001 | Bin 101 | Bin 111 |

| $x_{A1}$ | $x_{A3}$ | $x_{A2}$ | $x_{C1}$ | $x_{C2}$ | $x_{C3}$ |
|---|---|---|---|---|---|
| Bin 111 | Bin 110 | Bin 010 | Bin 000 | Bin 001 | Bin 011 | Bin 111 |

| $x_{A1}$ | $x_{A2}$ | $x_{A3}$ | $x_{C1}$ | $x_{C3}$ | $x_{C2}$ |
|---|---|---|---|---|---|
| Bin 111 | Bin 110 | Bin 100 | Bin 000 | Bin 001 | Bin 101 | Bin 111 |

| $x_{A1}$ | $x_{A2}$ | $x_{A3}$ | $x_{C1}$ | $x_{C2}$ | $x_{C3}$ |
|---|---|---|---|---|---|
| Bin 111 | Bin 110 | Bin 100 | Bin 000 | Bin 001 | Bin 011 | Bin 111 |

US 9,390,002 B1

EFFICIENT BIN LABELING SCHEMES FOR TRACKING CELLS IN SOLID STATE STORAGE DEVICES

CROSS REFERENCE TO OTHER APPLICATIONS

This application claims priority to U.S. Provisional Patent Application No. 61/755,792 entitled EFFICIENT BIN LABELING SCHEMES FOR GENERATING SOFT INFORMATION FOR HARD-READ NAND DEVICES filed Jan. 23, 2013 which is incorporated herein by reference for all purposes.

BACKGROUND OF THE INVENTION

FIG. 1 is a diagram illustrating an example of a typical technique to label bins created by performing multiples reads to a group of cells solid state storage. In diagram 100, three reads have been performed. The first read uses a read threshold of x1, the second read uses a read threshold of x2, and the third read uses a read threshold of x3. The three read thresholds form four bins: bin 102a (e.g., all voltages less than read threshold x1), bin 102b (e.g., all voltages between read threshold x1 and read threshold x2), bin 102c (e.g., all voltages between read threshold x2 and read threshold x3), and bin 102d (e.g., all read voltages greater than read threshold x3). Bins 102a-102d are labeled as bins 1-4, respectively, to uniquely identify the bins and track which cells fall into which bins.

Diagram 150 shows the addition of a fourth read using a read threshold of x4. Read threshold x4 divides bin 102c in diagram 100 into bins 152c and 152d in diagram 150. There are now five bins and the labels of bins 152a-152e are updated to be bins 1-5, respectively. Improved bin labeling techniques (e.g., which are more efficient) would be attractive.

BRIEF DESCRIPTION OF THE DRAWINGS

Various embodiments of the invention are disclosed in the following detailed description and the accompanying drawings.

FIGS. 13A and 13B are diagrams illustrating an embodiment of three-bit, direct write bin labels for the MSB of an MLC system where the MSB read thresholds have no constraints.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 2:
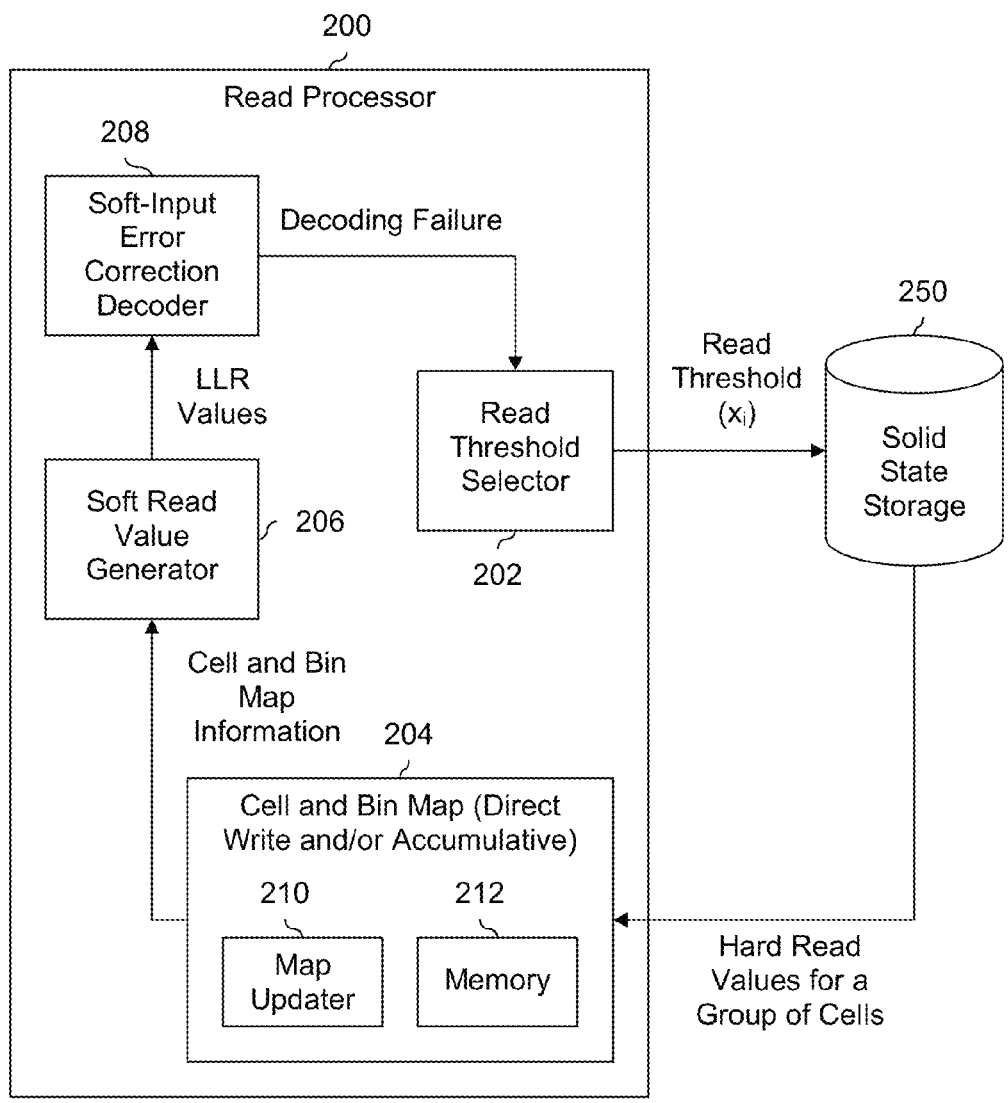
FIG. 2 is a diagram illustrating an embodiment of a read processor which uses direct write and/or accumulative bin labeling in a cell and bin map.

FIG. 2 is a diagram illustrating an embodiment of a read processor which uses direct write and/or accumulative bin labeling in a cell and bin map. In some embodiments, read processor 200 is implemented using a semiconductor device, such as an application-specific integrated circuit (ASIC) or a field-programmable gate array (FPGA). For clarity, a corresponding write processor is not described herein, but read processor 200 may be co-located (e.g., on the same "chip") as a corresponding write processor. In some embodiments, solid state storage 250 comprises another semiconductor device (e.g., different from one which includes read processor 200).

In the example shown, a group of cells (e.g., a page) in solid state storage 250 is read one or more times. Solid state storage 250 (e.g., natively) returns hard read values. For example, if solid state storage 250 includes single-level cells (SLC)

which are configured to store a single bit, then either a 0 or a 1 will be returned. Or, if solid state storage 250 includes multi-level cells (MLC) which are configured to store two bits, then 00, 01, 10, or 11 will be returned. However, it takes two reads to obtain both bits. For example, one read is for the LSB bit and the other read is for the MSB bit. Other types of cells (e.g., a triple-level cell (TLC) which is configured to store three bits or a quad-level cell (QLC) which is configured to store four bits) may also be used. Note that in solid state storage, it is not possible to read a single cell. As such, when a read is performed, it is always a group of cells which is read.

The hard read values for a group of cells are passed from solid state storage 250 to cell and bin map 204 in read processor 200. Map 204 includes map updater 210 and memory 212 and tracks which cells in the group being read fall into which bins. For example, if the last read has a read number of two (i.e., two reads have been performed), then there are three bins created by the two read thresholds. Map 204 tracks which bin (e.g., of the three bins in this example) each cell in the group falls into using a direct write bin labeling technique and/or an accumulative bin labeling technique. Note that read processor 200 does not know the exact voltage stored by each cell, just which bin each cell falls into. Put another way, the range of voltages which are possibly stored by a given cell is known. Various examples of the direct write bin labeling and accumulative bin labeling techniques (one or both of which are employed by map 204) are described in further detail below.

The cell and bin map information stored in map 204 is passed to soft read value generator 206, which generates soft read values (i.e., values indicating the probability that each cell was written with a 0 or 1) to be used by soft-input error correction decoder 208. Soft read value generator 206 may, for example, indicate it is ready for cell and bin map information, and map 204 outputs, for each cell in a group of cells, which bin a given cell falls into. Soft-input error correction decoder 208 is configured to input soft read values and so soft read value generator 206 synthesizes those soft read values since solid state storage 250 does not natively output soft read values. For example, all cells falling into a first bin are assigned a first soft read value (e.g., a first 1-likelihood ratio (LLR) value), all cells falling into a second bin are assigned a second soft read value (e.g., a second LLR value), and so on. In this example, the soft read values output by soft read value generator 206 are in the form of LLR values, where the sign indicates or corresponds to a decision (e.g., a positive sign corresponds to a 0 and a negative sign corresponds to a 1 or vice versa) and the magnitude corresponds to a certainty or likelihood associated with that decision. For example, if the maximum possible magnitude is 15, then a +15 corresponds to a strongest or most certain 0 and a −15 corresponds to a strongest or most certain 1.

Soft-input error correction decoder 208 performs error correction decoding on the LLR values generated by soft read value generator 206. In one example, soft-input error correction decoder 208 is a soft-input, low-density parity check (LDPC) decoder. If decoder 208 is able to successfully decode the LLR values (e.g., after one or more attempts), then read processor 200 outputs the decoded values of the group of cells and moves on to another group of cells to be read.

If, however, decoder 208 is unable to successfully decode the LLR values (e.g., because the errors are beyond the error correction capability of the code), then a decoding failure signal is sent to read threshold selector 202. In response to receiving the decoding failure signal, read threshold selector 202 determines one or more new read thresholds (i.e., for the $i^{th}$ read, a new read threshold of $x_i$ is generated).

Note that the direct write and accumulative bin labeling techniques described herein may be used with any soft read value generation technique (e.g., employed by generator 206) and with any read threshold selection technique (e.g., employed by selector 202).

The following figure describes a direct write bin labeling process.

Figure 3:
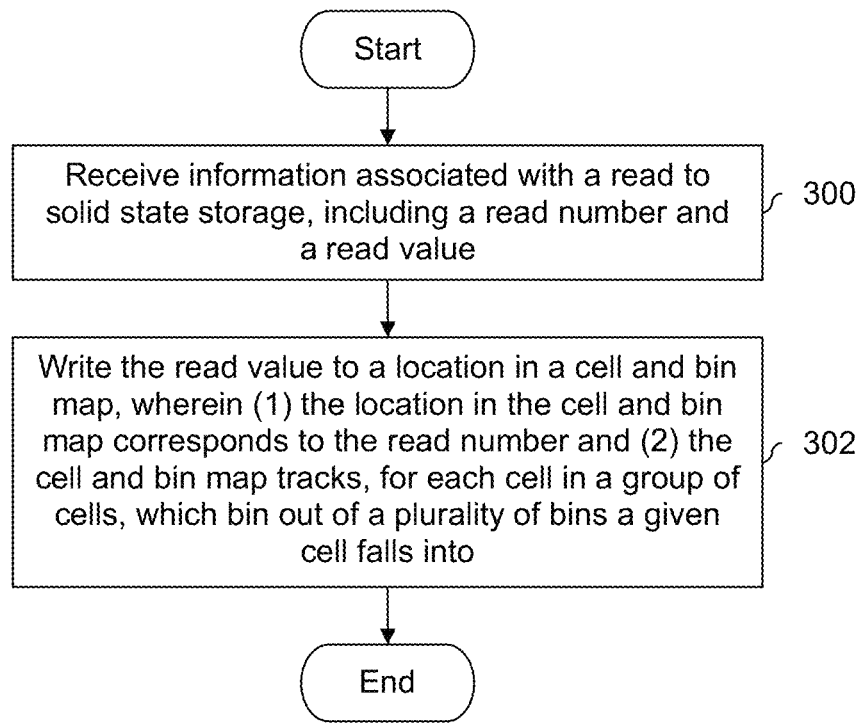
FIG. 3 is a flowchart illustrating an embodiment of a direct write bin labeling process.

FIG. 3 is a flowchart illustrating an embodiment of a direct write bin labeling process. In some embodiments, the process shown includes SLC embodiments where the cells store a single bit. In some embodiments, the process shown includes MLC embodiments where the cells store two bits. In some embodiments, map updater 210 in FIG. 2 performs the process shown. In some other systems, some other component may perform the process.

At 300, information associated with a read to solid state storage is received, including a read number and a read value. The read number indicates if the read is a first read (e.g., the read number is one), a second read (e.g., the read number is two), a third read (e.g., the read number is three), and so on. Once a group of cells is successfully decoded the read number may be reset. The read value is the value read back from solid state storage. For a single cell, for example, the read value may be either 0 or 1. In some embodiments, the read value is the value read for a group of cells. For example, if a group of eight SLC cells is being read, then the read value at 300 may be [0 0 1 0 1 1 1 0].

At 302, the read value is written to a location in a cell and bin map, wherein (1) the location in the cell and bin map corresponds to the read number and (2) the cell and bin map tracks, for each cell in a group of cells, which bin out of a plurality of bins that cell falls into. In a direct write bin labeling technique, each bit position in the bin label corresponds to a particular read number so that the bin label indicates what values were read back for those cells in that bin at each of the reads. For example, the first read may correspond to the least significant bit (LSB) in the bin label (e.g., the rightmost bit in the bin label) and whatever value is located in the LSB of the bin label indicates what value was read back for that cell at the first read. Direct write bin labels are described in further detail below.

Figure 4:
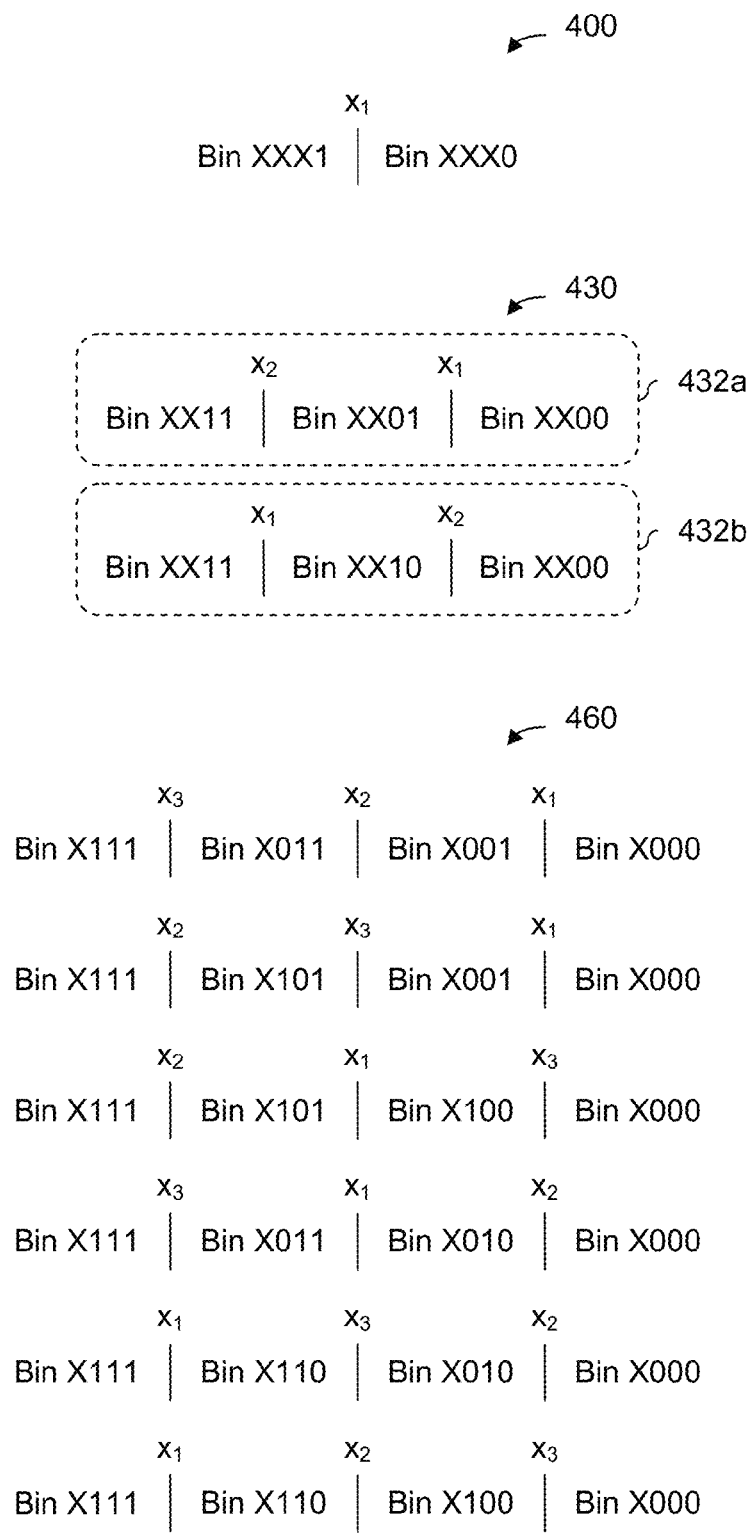
FIG. 4 is a diagram illustrating an embodiment of four-bit, direct write bin labels in an SLC system.

FIG. 4 is a diagram illustrating an embodiment of four-bit, direct write bin labels in an SLC system. Note that various examples described herein show various (e.g., fixed) numbers of bits allocated or available for bin labeling. In this figure and the next, for example, four bits are allocated for bin labeling. These fixed numbers of bits are merely exemplary and are not intended to be limiting.

In SLC systems such as this one, either a 1 or a 0 will be returned, depending both upon the particular read threshold (i.e., $x_i$) and the voltage stored by a particular cell. In examples described herein, cells which store a voltage less than the read threshold are read or interpreted as a 1. Cells which store a voltage greater than the read threshold are interpreted or read as a 0. Note that this interpretation is merely exemplary and the direct write bin labeling technique and accumulative bin labeling technique work even with the opposite read values (e.g., even when a cell with a voltage less than the read threshold is read as a 0 and a cell with a voltage greater than the read threshold is read as a 1).

Diagram 400 shows the direct write bin labels after one read. The bin to the left of read threshold $x_1$ is labeled XXX1 and the bin to the right of read threshold $x_1$ is labeled XXX0. Thus, if a given cell is read as a 1 during the first read, then it is said that that cell falls into bin XXX1. If a given cell is read as a 0 during the first read, then it is said that that cell falls into bin XXX0. Similarly, it is known that all cells which fall into bin XXX0 were read as a 0 during the first read and all cells in bin XXX1 were read as a 1 during the first read.

To clearly indicate how many reads have occurred at a particular point in time, one or more "X" marks are used in the direct write bin label examples to indicate those reads which have not yet occurred. In diagram 400, for example, since the second, third, and fourth reads have yet to be performed, the three most significant bits in the bin labels have an X. Note that this use of X is merely for illustrative purposes in order to clearly describe the direct write bin labeling technique. In actual practice, some known or default value (e.g., a default 0 or a default 1) may be used in place of those writes which have not yet occurred.

Diagram 430 shows the direct write bin labels after two reads. Bin labels 432a show bin labels when the second read threshold (used at the second read) is less than the first read threshold (used at the first read). In other words, $x_2 < x_1$. For that read threshold relationship, the bin to left of read threshold $x_2$ is labeled XX11, the bin which is between $x_2$ and $x_1$ is labeled XX01, and the bin to the right of read threshold x1 is labeled XX00.

In bin labels 432a, cells which were read as a 1 during both the first and second read would fall into bin XX11. Cells which were read as a 1 at the first read and then a 0 at the second read would fall into bin XX01. Cells which were read as a 0 during both the first and second read would fall into bin XX00. In some embodiments, if a 0 is read first and then a 1 is read second, an arbitrary label is used.

Bin labels 432b show the bin labels when the first read threshold is less than the second read threshold (i.e., $x_1 < x_2$). For that relationship, the bin labels are (from left to right): XX11, XX10, and XX00. Cells read as a 1 during both the first and second read fall into bin XX11, cells read as a 0 during the first read and a 1 during the second read fall into bin XX10, and cells read as a 0 during both reads fall into bin XX00. Similar to 432a, reading a 1 first and then a 0 is not possible given the $x_1 < x_2$.

Diagram 460 shows the six possible sets of direct write bin labels given three read thresholds. Note that since there are three read thresholds, the number of possible sets is $3! = 3 \times 2 \times 1 = 6$ (e.g., $x_3 < x_2 < x_1$, $x_2 < x_3 < x_1$, and so on). For brevity, all of the bin labels shown in diagram 460 are not redundantly described herein.

Figure 5:
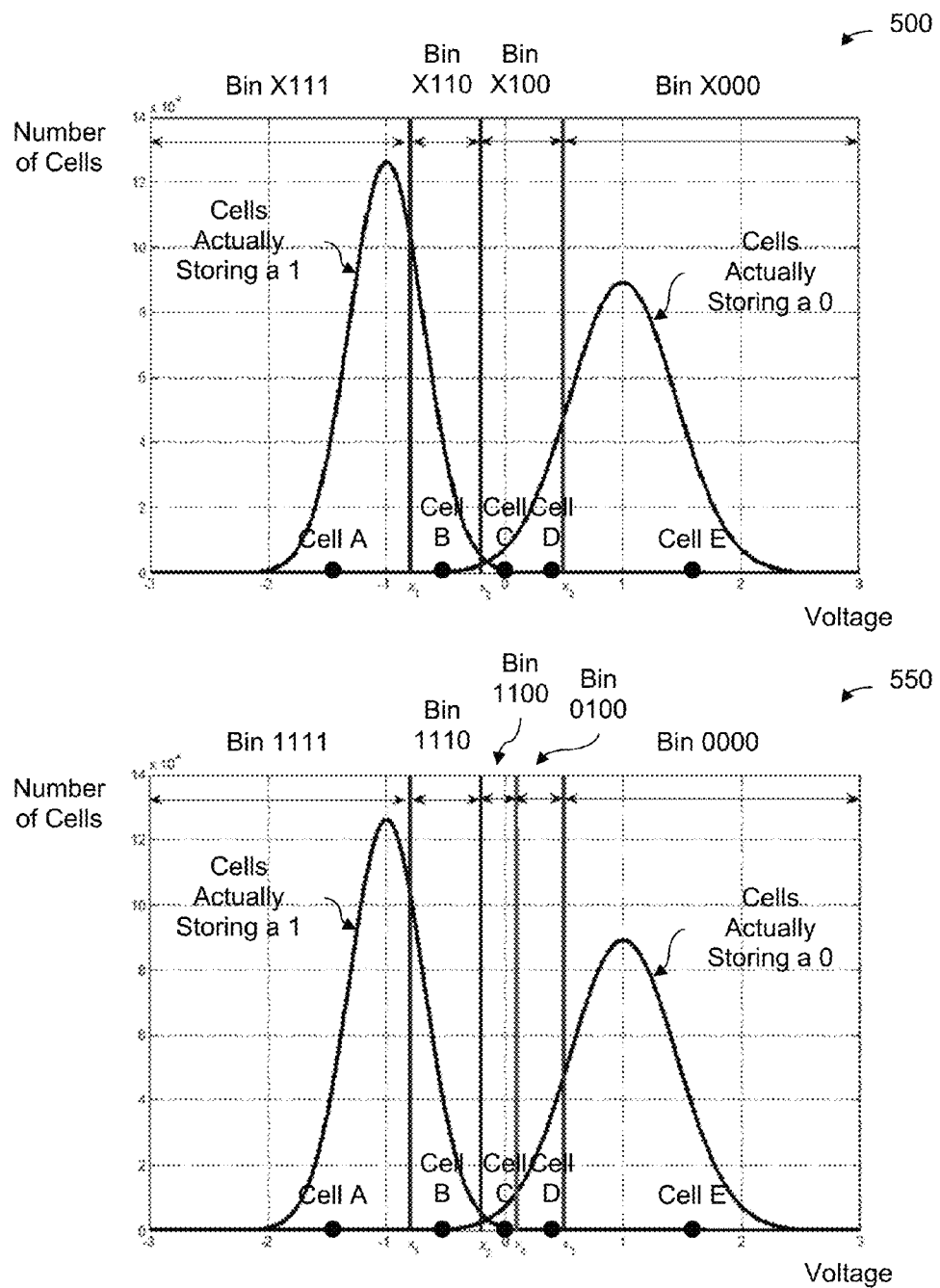
FIG. 5 is a diagram illustrating an embodiment of four-bit, direct write bin labels, including SLC distributions.

FIG. 5 is a diagram illustrating an embodiment of four-bit, direct write bin labels, including SLC distributions. FIG. 5 continues the example of FIG. 4. In the example shown, the distributions of those SLC cells actually storing a 1 and those SLC cells actually storing a 0 are shown. In this example, diagram 500 shows the bin labels after three reads and diagram 550 shows the bin labels after four reads. The relationship of the read thresholds is: $x_1 < x_2 < x_4 < x_3$ and so the bin labels after three reads in diagram 500 are (from left to right): X111, X110, X100, and X000. The bin labels in diagram 550 after four reads are (from left to right): bin 1111, bin 1110, bin 1100, bin 0100, and bin 0000.

Figure 6:
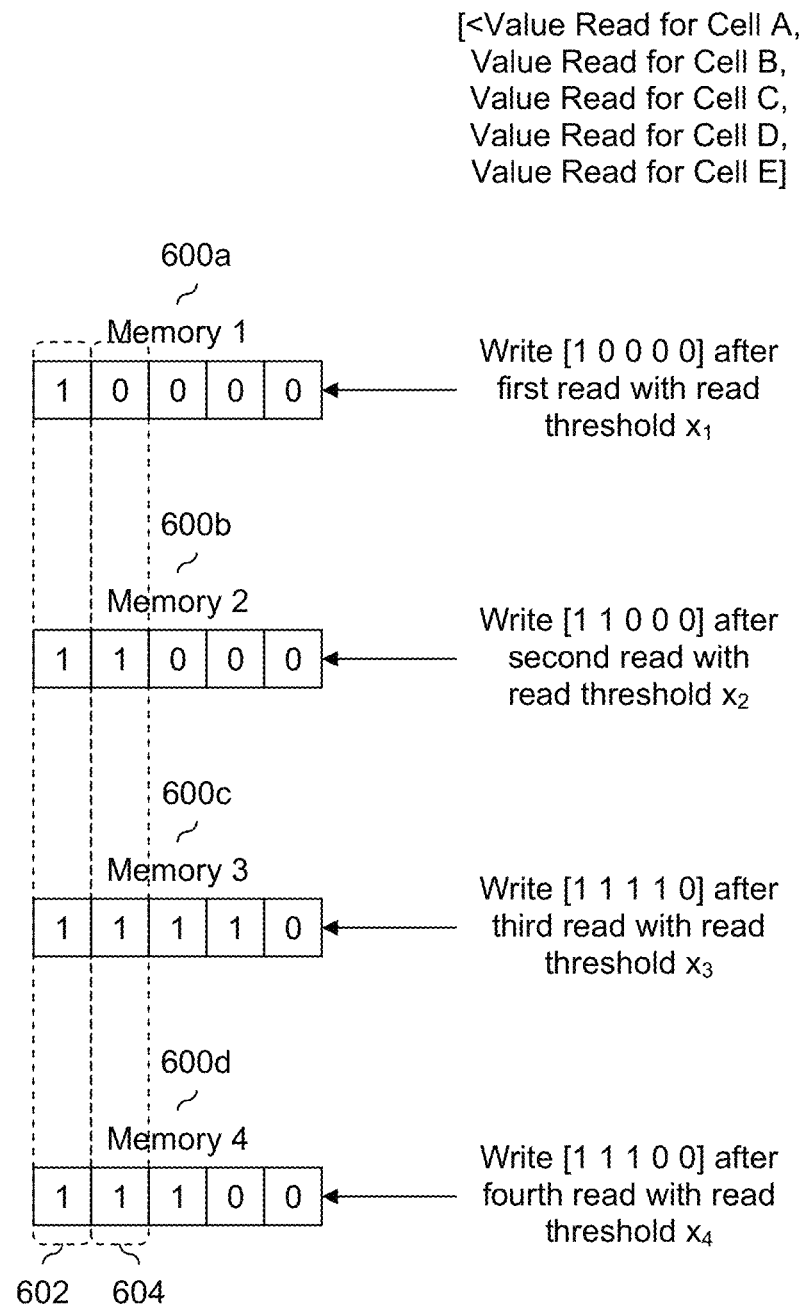
FIG. 6 is a diagram illustrating an embodiment of a group of memories which stores four-bit, direct write bin labels for a group of cells.

FIG. 6 is a diagram illustrating an embodiment of a group of memories which stores four-bit, direct write bin labels for a group of cells. FIG. 6 continues the example of FIG. 5. Diagrams 500 and 550 in FIG. 5 show the voltages of cells A-E. The group of cells comprising cells A-E is read and FIG. 6 shows what information is stored after each read. In some embodiments, memory 212 in FIG. 2 includes memories 600a-600d and they are written as shown in this example. Note that although memories 600a-600d are shown as separate memories, they may in fact be a single memory and each of memories 600a-600d may be implemented as a different address or offset in the same (e.g., physical) memory.

In the example shown, a different memory is written with the values read for that particular read number. At the first read, the values [1 0 0 0 0] are read for cells A-E, respectively, given the voltages of cells A-E shown in FIG. 5 and the value of $x_1$. This is because only cell A has a voltage less than $x_1$, so cell A is read as a 1 and cells B-E are read as a 0. As such, after the first read, [1 0 0 0 0] is written to memory 600a. Referring back to FIG. 3, [1 0 0 0 0] is an example of a read value written at 302 and memory 600a is an example of a location in a cell and bin map corresponding to a read sequence number at step 302.

At the second read, the read value is [1 1 0 0 0] and this value is written to memory 600b. Cells A and B have a voltage less than read threshold $x_2$, so they are read as a 1 and cells C-E are read as a 0. After the third read, [1 1 1 1 0] is written to memory 600c and after the fourth read, [1 1 1 0 0] is written to memory 600d. Note that if a successful decoding of the group of cells occurred, then process shown would terminate. The sequence of writes described herein would only be performed while the group of cells has yet to be successfully decoded.

The information stored in memories 600a-600d comprises a cell and bin map. As described above, a cell and bin map tracks which cell falls into which bin. Column 602 shows the bin label indicating which bin cell A falls into (in this case, bin 1111). Similarly, column 604 shows the bin label indicating which bin cell B falls into (in this case, bin 1110). Referring back to diagram 550 in FIG. 5, it can be seen that cells A and B fall respectively into bins 1111 and 1110 after the fourth read, as indicated by columns 602 and 604 in FIG. 5.

Figure 1:
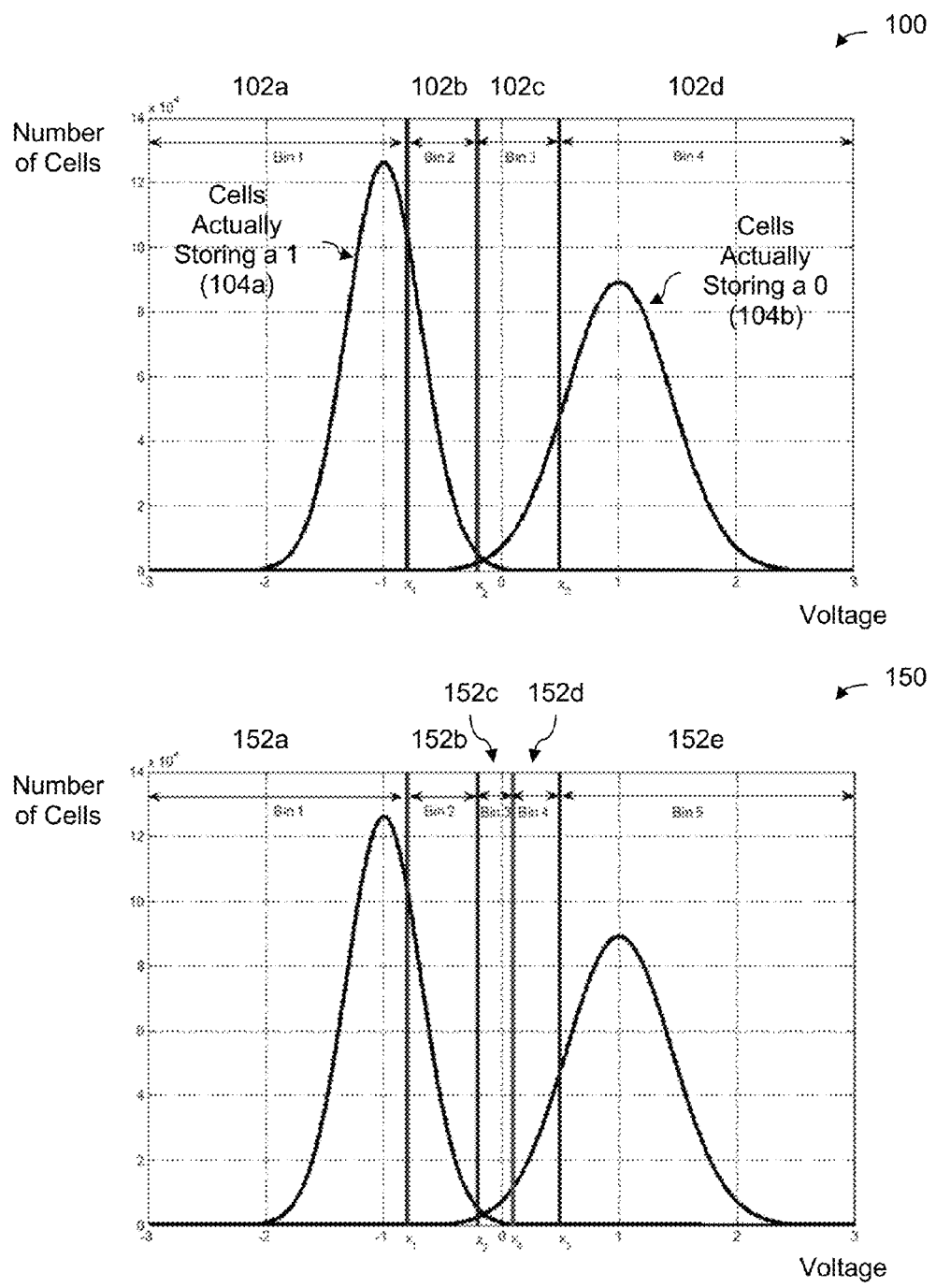
FIG. 1 is a diagram illustrating an example of a typical technique to label bins created by performing multiples reads to a group of cells solid state storage.

One benefit to direct write bin labeling is that it reduces the total number of reads and/or writes to memory when updating a cell and bin map with each new read, which in turn saves power. Suppose, for example, the read thresholds go from left to right (e.g., $x_4 < x_3 < x_2 < x_1$). With the bin labeling technique shown in FIG. 1, this would necessitate a change to all of the bin labels except for the leftmost bin. This translates into a large number of reads from memory (e.g., to get the old bin labels) and writes to the memory (e.g., with the new bin labels), which consumes power.

In contrast, with direct write bin labeling, the memories which have been previously written to do not need to be read, nor do those memories have to be written to again. For example, after the fourth read, memories 600a-600c do not need to be read before memory 600d is written, nor do memories 600a-600c need to be written to when memory 600d is written to. Fewer accesses to memory translates into less power consumed.

Another benefit of direct write bin labeling is error mitigation when synthesizing soft read values. For example, with the bin labeling technique shown in FIG. 1, only the map information for the bin being split is updated. Suppose at the first read, a cell is misread as a 1 (when it should have been read as a 0) and thus the misread cell is incorrectly assigned to bin 1. The second read (using a read threshold of $x_2$) will not split bin 1, so the cell will still be incorrectly assigned to bin 1 after the second read. Similarly, the third and fourth read will not split bin 1, so the misread cell will still be incorrectly assigned to bin 1. This will cause a soft read value generator to output a decision of 1 (e.g., an LLR value which is negative) instead of properly outputting a decision of 0 (e.g., an LLR value which is positive). This supplies a soft-input error correction decoder with a poor quality LLR value for that cell.

In contrast, with direct write bin labeling, a misread will produce better LLR values. For example, suppose the same misread occurs where the first read incorrectly returns a 1 instead of a 0, but suppose the rest of the reads correctly return read values of 0. The cell will be assigned to bin 1000, which is not a valid or defined bin, so a soft read value generator can assign a neutral LLR value or an erasure value (e.g., LLR=0) for that cell. A neutral LLR value is not as bad as outputting an incorrect decision (e.g., a decision of 0 instead of 1 or vice versa). Also, the probability of multiple reads being wrong is very low, so the likelihood of the misread cell being assigned to bin 1111 or bin 1110 (which are valid bins, but not correct for the misread cell) as an example is very low.

Next, some accumulative bin labeling examples are described.

Figure 7:
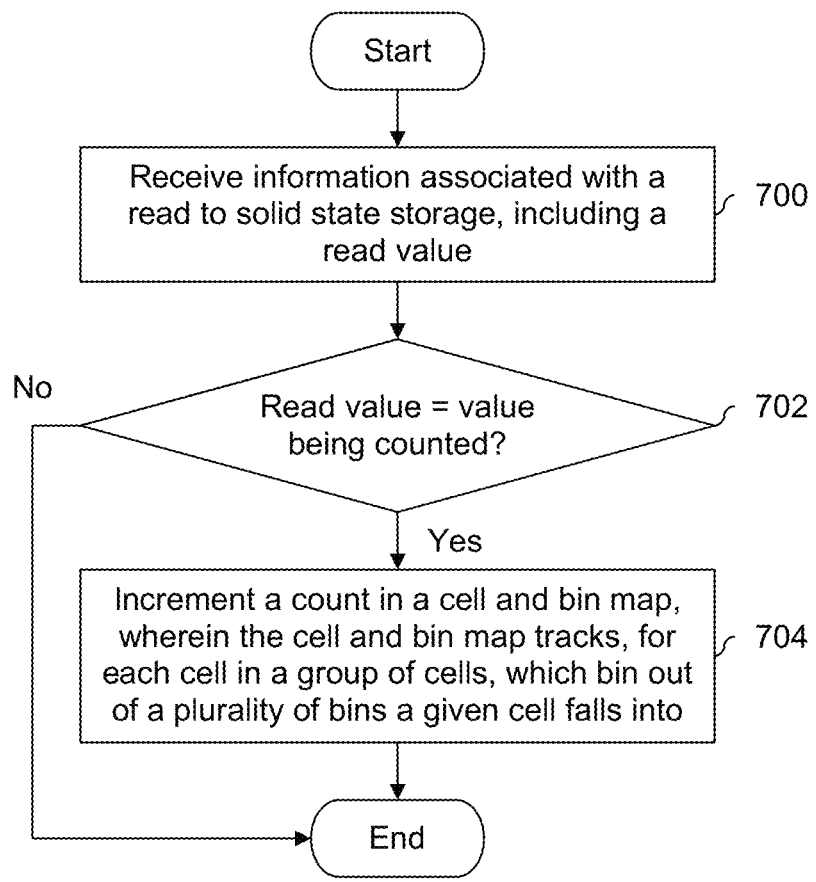
FIG. 7 is a flowchart illustrating an embodiment of an accumulative bin labeling process.

FIG. 7 is a flowchart illustrating an embodiment of an accumulative bin labeling process. In some embodiments, the process shown includes SLC embodiments where the cells store a single bit. In some embodiments, the process shown includes MLC embodiments where the cells store two bits. In some embodiments, map updater 210 in FIG. 2 performs the process shown. In some other systems, some other component may perform the process.

At 700, information associated with a read to solid state storage is received, including a read value. For example, the read value may be for a group of cells being read. At 702, it is determined if the read value matches a value being counted. For example, in an SLC system, if the value being counted is a 1 but the read value is a 0, then the decision at 702 would be No.

If it is determined at 702 that the read value matches the value being counted, then a count in a cell and bin map is incremented, wherein the cell and bin map tracks, for each cell in a group of cells, which bin out of a plurality of bins a given cell falls into. For example, if the value being counted is 1 and a cell is assigned to bin 3, then a 1 was read three times for that cell. Unlike direct write bin labeling, the specific sequence of read values for a given cell cannot be reconstructed from accumulative bin labeling. For example, if the system has performed 4 reads, it is not known (for cells assigned to bin 3) if the first, second, and fourth reads were a 1 (which corresponds to a count of 3), or if the first through third reads were a 1 (which also corresponds to a count of 3).

Figure 8:
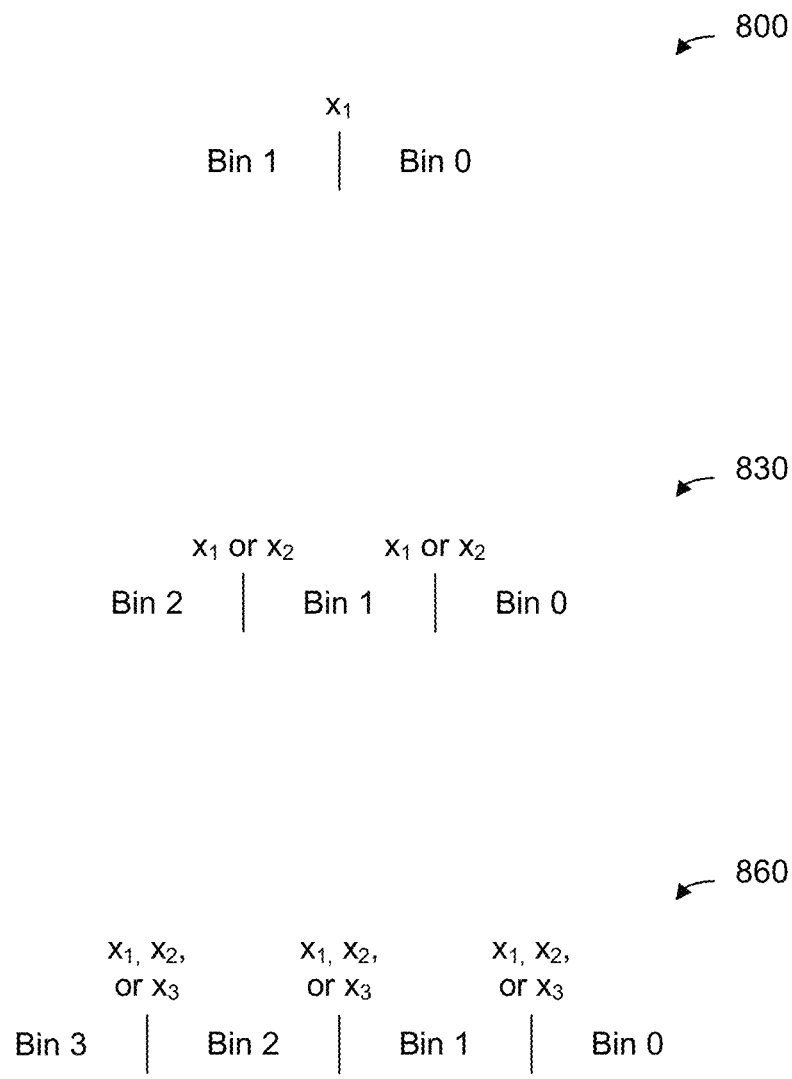
FIG. 8 is a diagram illustrating an embodiment of accumulative bin labels.

FIG. 8 is a diagram illustrating an embodiment of accumulative bin labels. In the example shown, the bin labels reflect the number of times a 1 was read for the group of cells in a particular bin. Diagram 800 shows the possible bin labels after one read. The bin to the left of read threshold $x_1$ is labeled 1, since a 1 has been read one time. The bin to the right of read threshold $x_1$ is labeled 0, since a 1 has been read zero times.

Diagram 830 shows the accumulative bin labels after two reads. In accumulative bin labeling, the relationships of the read thresholds do not affect the bin labels. Put another way, the same bin labels result when $x_1 < x_2$ as when $x_2 < x_1$. As is shown in diagram 830, the leftmost bin is labeled 2, because (for the cells that fall into that bin) a 1 is read two times. The center bin is labeled 1 because (for the cells that fall into that bin) a 1 is read one time. Similarly, the rightmost bin is labeled 0 because (for the cells that fall into that bin) a 1 is read zero times.

Diagram 860 shows the accumulative bin labels after three reads. The bin labels after three reads are (from left to right): bin 3, bin 2, bin 1, and bin 0. As before, the relationships of the read thresholds (e.g., greater than or less than) do not affect the bin labels.

Figure 9:
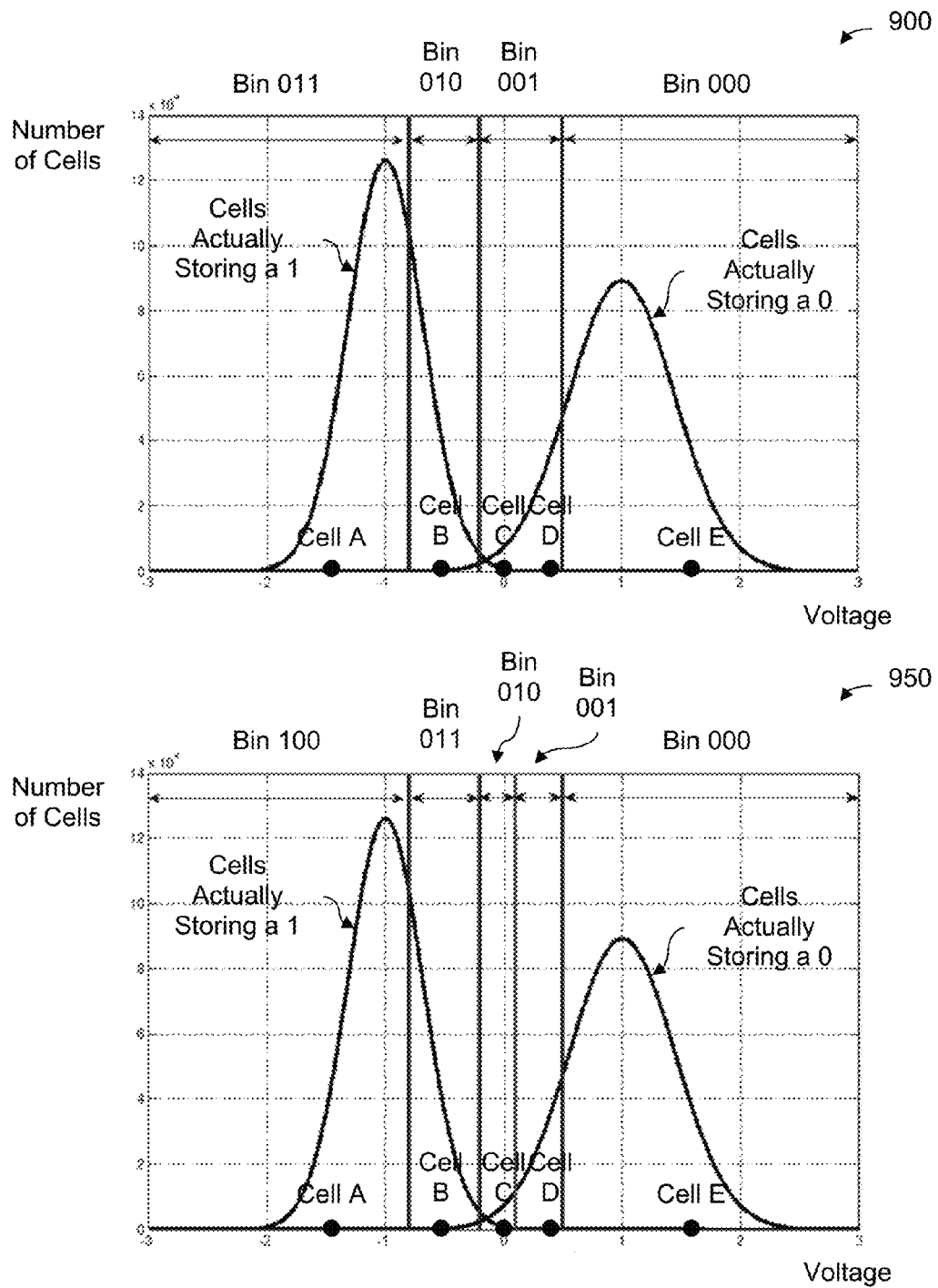
FIG. 9 is a diagram illustrating an embodiment of three-bit, accumulative bin labels, including SLC distributions.

FIG. 9 is a diagram illustrating an embodiment of three-bit, accumulative bin labels, including SLC distributions. FIG. 9 continues the example of FIG. 8, except FIG. 8 shows the bin labels in base 10 whereas FIG. 9 shows the bin labels in base 2. In diagram 900, the leftmost bin is labeled bin 3 (or 011 in base 2 when represented using 3 bits) since a value of 1 is read three times for cells in that bin (e.g., using read thresholds $x_1$, $x_2$, and $x_3$). Similarly, the other bins are (from second-to-left to right): bin 2 (i.e., bin 010), bin 1 (i.e., bin 001), and bin 0 (i.e., bin 000). Note that since the relationships of the read thresholds do not affect the bin labels, the read thresholds are not labeled in this figure.

Diagram 950 shows the bin labels after four reads. From left to right, the bin labels are: bin 4 (i.e., bin 100), bin 3 (i.e., bin 011), bin 2 (i.e., bin 010), bin 1 (i.e., bin 001), and bin 0 (i.e., bin 000).

Figure 10:
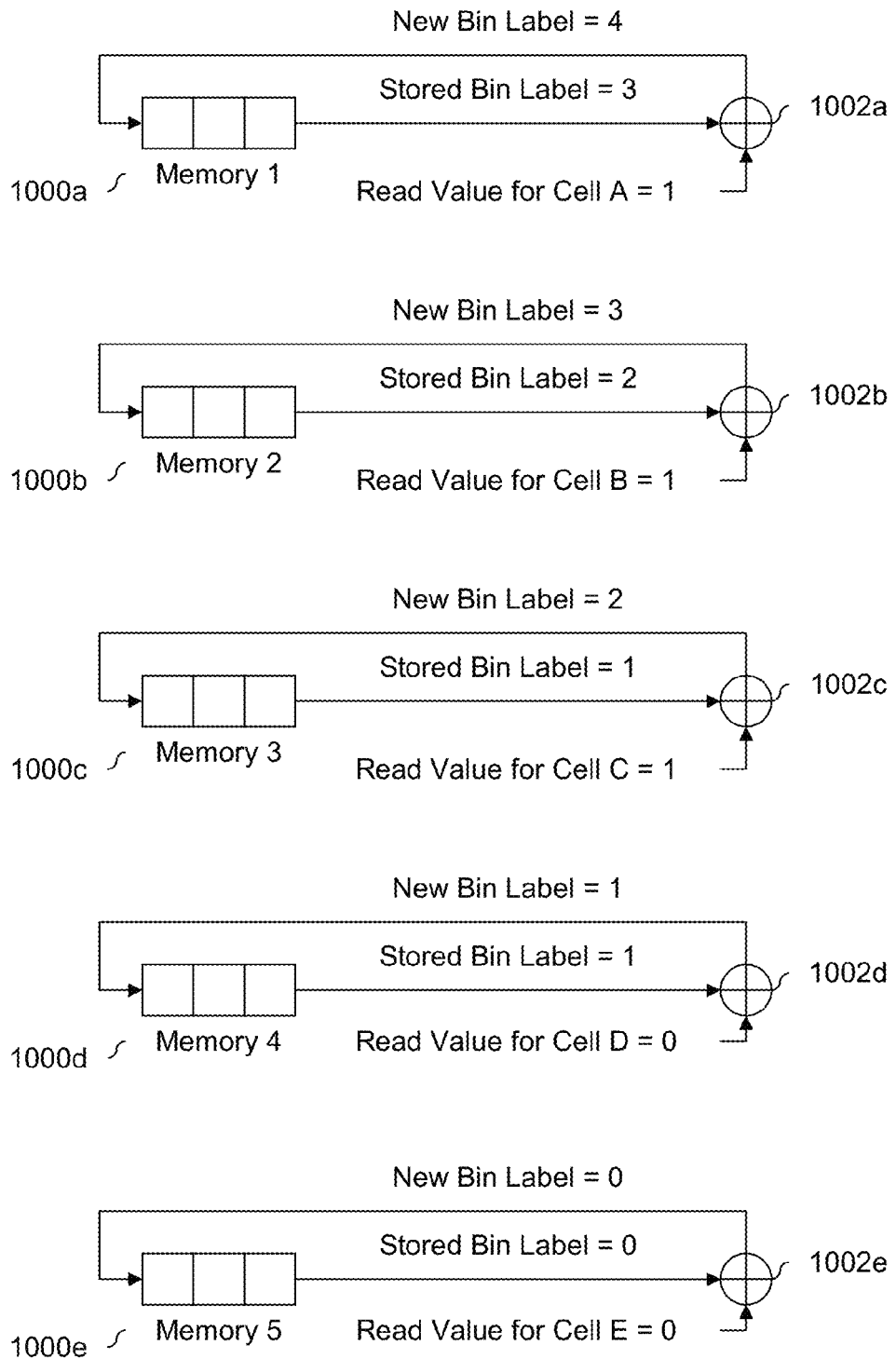
FIG. 10 is a diagram illustrating an embodiment of a group of memories which store three-bit, accumulative bin labels for a group of cells.

FIG. 10 is a diagram illustrating an embodiment of a group of memories which store three-bit, accumulative bin labels for a group of cells. FIG. 10 continues the example of FIG. 9 and shows the bin labels in base 10. In the example shown, a group of cells (comprising cells A-E from FIG. 9) is being read. In some embodiments, cell and bin map 204 in FIG. 2 includes memories 1000a-1000e and they are updated as shown in this example using adders 1002a-1002e. As before, memories 1000a-1000e may be implemented as a single (e.g., physical) memory.

In the example shown, memories 1000a-1000e are used to store (respectively) the bin labels of the bins which cells A-E fall into (see, e.g., FIG. 9). At the point in time shown in FIG. 10, a fourth read has been performed and memories 1000a-1000e are being updated with the bin labels associated with the fourth read for cells A-E, respectively. The output of memories 1000a-1000e shows the bin labels associated with the third read of cells A-E, respectively.

The other inputs to adders 1002a-1002e are the read values returned for cells A-E at the fourth read (see, e.g., diagram 950 in FIG. 9). In this example, the read value being counted is a 1, so the read value itself is directly input to adders 1002a-1002e. This is because a read value of 0 will not cause a given count to increment, but a read value of 1 will cause a count to increment. Alternatively, if the read value that is being counted is a 0, then each of adders 1002a-1002e may have an inverter between it and the read values from solid state storage so that a read value of 0 will cause a given count to increment.

Adders 1002a-1002e output the new bin labels which cells A-E fall into, respectively. The new bin labels are then passed back to memories 1000a-1000e for storage (e.g., until they are requested by a soft read value generator). In this particular example, three fixed bits are available for bin labels, but any number of bits may be allocated for bin labels.

A benefit of accumulative bin labeling compared to direct write bin labeling is that a cell and bin map associated with more reads can be stored with the same number of bits. For example, suppose three bits are available for bin labels. With direct write bin labeling, those three bits can store (at most) a cell and bin map associated with three writes. With accumulative bin labeling, however, those three bits can store (at most) a cell and bin map associated with seven reads. For applications where it is desirable for the maximum number of reads to be as large as possible (e.g., noisy applications or high performance applications), accumulative bin labeling is a more attractive option compared to direct write bin labeling. Some embodiments which describe how the two techniques may be used in combination (e.g., in order to avoid exceeding a fixed number of bits available for bin labeling) are described in further detail below.

Another benefit of accumulative bin labeling is that misreads are averaged out, which mitigates errors during the soft read generation process. Having more than one misread is a very rare occurrence, so it is assumed that there is at most one misread. Thus, for a single misread, a cell that is supposed to be in bin 4 (for example) is erroneously assigned to bin 3 or 5 with the accumulative bin labeling technique. Although incorrect, it is near the correct bin (e.g., bin 4) and, therefore, will be assigned an LLR close to its proper or actual value (in this example, the LLR value associated with bin 4).

In some embodiments, a solid state storage system uses cells which store two or more bits. Put another way, at each read, two or more read thresholds are used. To show how such systems may use direct write bin labeling and/or accumulative bin labeling, some MLC examples are described in further detail below.

Figure 11:
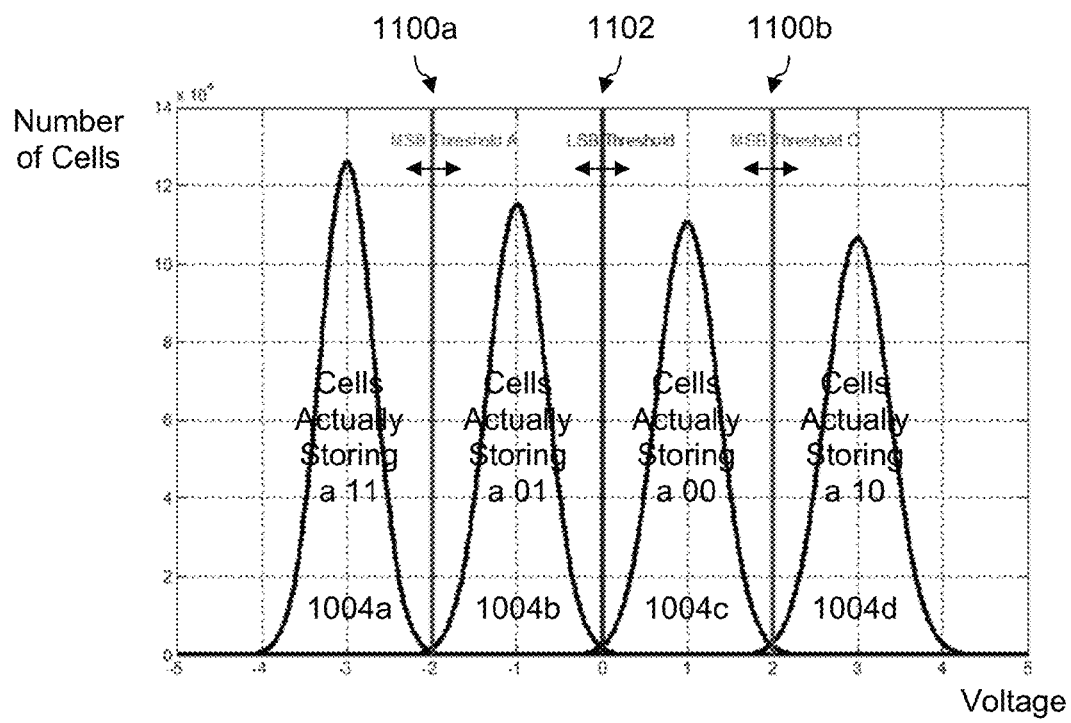
FIG. 11 is a diagram illustrating an embodiment of MLC distributions.

FIG. 11 is a diagram illustrating an embodiment of MLC distributions. As described above, in MLC systems, cells are configured to store 2 bits, for a total of four possible values. Distribution 1104*a* shows the distribution of cells actually storing a 11, distribution 1104*b* shows the distribution of cells actually storing a 01, distribution 1104*c* shows the distribution of cells actually storing a 00, and distribution 1104*d* shows the distribution of cells actually storing a 10. In the example shown, a Gray code is used to minimize bit error rates.

When reading the example MLC system shown, a read processor will vary one or more of read thresholds 1100*a*-1100*b* and 1102 over multiples reads until the group of cells being read is successfully decoded. Read threshold 1102 is associated with a least significant bit (LSB) and may be referred to herein as an LSB read threshold. Cells having a voltage below the LSB read threshold are read as having an LSB of 1. Cells having a voltage above the LSB read threshold are read as having an LSB of 0. As such, direct write bin labeling and accumulative bin labeling may applied to the LSB and the LSB read threshold in a straight forward manner as described above.

The read value of the MSB depends upon read thresholds 1100*a* and 1100*b* and those thresholds may be referred to as MSB read thresholds. To differentiate between the two MSB read thresholds, read threshold 1100*a* may be referred to as MSB read threshold A and read threshold 1100*b* may be referred to as MSB read threshold C. Cells having either a voltage below read threshold A (1100*a*) or having a voltage above read threshold C (1100*b*) are interpreted or read as having an MSB of 1. Cells with a voltage between the two MSB read thresholds are interpreted or read as having an MSB of 0. The following figures describe some examples of how direct write bin labeling and/or accumulative bin labeling may be employed for the MSB and MSB read thresholds.

Figure 12:
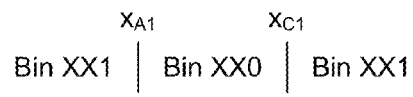
FIG. 12 is a diagram illustrating an embodiment of three-bit, direct write bin labels in a MLC system where the MSB read thresholds are constrained to mirror each other.
Figure 12:
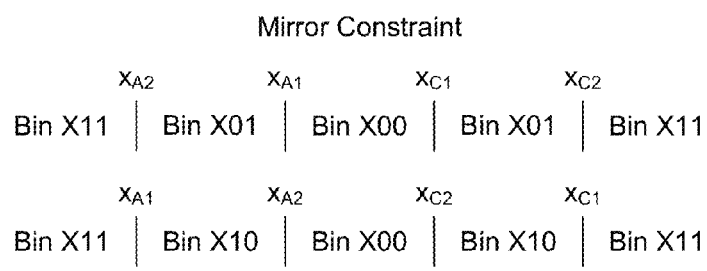
Figure 12:
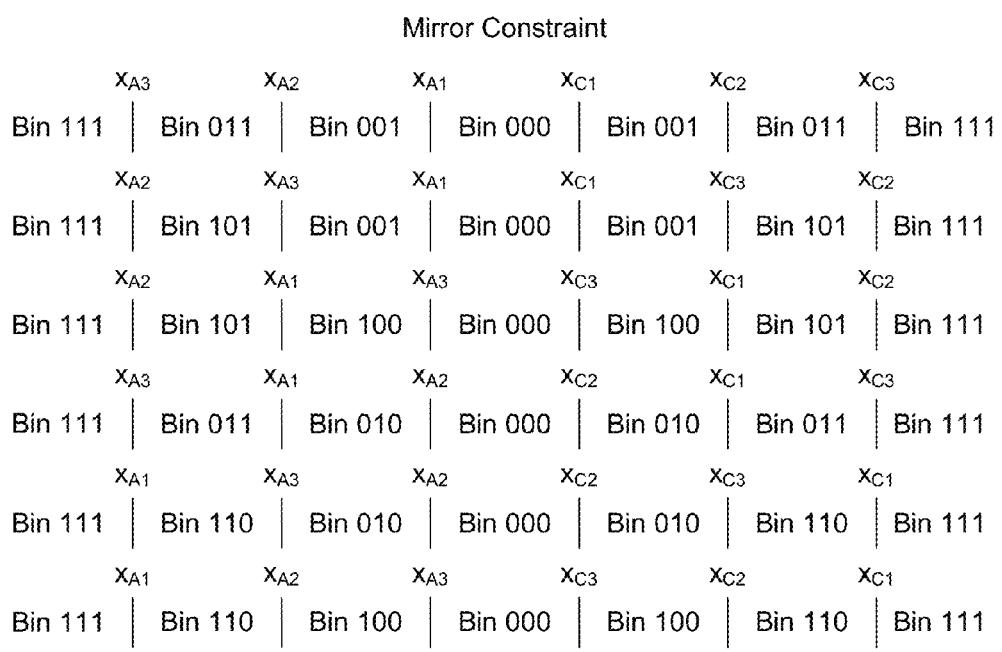

FIG. 12 is a diagram illustrating an embodiment of three-bit, direct write bin labels in a MLC system where the MSB read thresholds are constrained to mirror each other. In the example shown, MSB read threshold A (e.g., 1100*a* in FIG. 11) and MSB read threshold C (e.g., 1100*b* in FIG. 11) are constrained to mirror each other during successive reads. In other words, from one read to the next, the two MSB read thresholds can either move towards each other or away from each other, but they both cannot move to the right, nor can they both move to the left. In some embodiments, a mirror constraint is enforced at a read threshold generator (e.g., the read threshold generator is not permitted to generate two MSB read thresholds that both move left or both move right).

With this mirror constraint, the three-bit, direct write bin labels for the MSB are shown. Diagram 1200 shows the MSB bin labels after one read. Note that $x_{Ai}$ refers to the MSB read threshold A at the $i^{th}$ read and $x_{Cj}$ refers to the MSB read threshold C at the $j^{th}$ read. As before, an X is used to indicate those bits which have not yet been written to because the corresponding read has not yet occurred.

Diagram 1230 shows possible bin labels after two reads. The top set of bin labels in diagram 1230 shows the direct write bin labels when the two MSB read thresholds move away from each other. The bottom set of bin labels in diagram 1230 show the direct write bin labels when the two MSB read thresholds move towards each other.

Diagram 1260 shows possible bin labels after three reads. For brevity, all of the combinations shown in diagram 1260 are not described herein.

With a mirror constraint, the bin labels which result are symmetric about the center bin. Note, for example, that the leftmost bin labels match the rightmost bin labels in diagrams 1200, 1230, and 1260. Similarly, the second-from-left bin labels match those that are second-from-right and so on.

In some applications, a soft read value generator may want the cell and bin map information which is input to differentiate between cells in two bins having the same label. The soft read value generator may use this information to generate LLR values. If needed, the LSB can be used to for this purpose. For example, to differentiate between bin XX1 on the left and bin XX1 on the right in diagram 1200, the LSB can be used. If the LSB is 1, then the bin is the left hand side bin XX1. If the LSB is 0, then the bin is the right hand side bin XX1.

In some embodiments, constraining the MSB read thresholds to mirror each other is desirable because it results in symmetrical bin labels, which in turn results in symmetrical LLR magnitudes (or, more generally, symmetrical certainties or likelihoods) generated by a soft read value generator. For example, suppose the LLR values generated range from −15 to +15. For the five bins shown in diagram 1230, the following exemplary LLR values may be generated: [−15 −7 0 +7 +15]. For the seven bins shown in diagram 1260, the following exemplary LLR values may be generated: [−15 −10 −5 0 +5 +10 +15]. Note that in both examples, the magnitudes of the LLR values are symmetrical about the center.

Alternatively, in some MLC applications it may be unattractive to constrain the two MSB read thresholds to mirror each other. For example, although the actual distributions are not known, in some cases the optimal values of the two MSB read thresholds (e.g., the voltage at which two distributions intersect each other) are such that they require the mirror constraint to be broken (e.g., the two MSB read thresholds both have to move left in order to reach their optimal values, or they both have to move right in order to reach their optimal values). As such, in some MLC applications it is desirable to not constrain MSB read thresholds. The following figures describe some direct write bin labels in a MLC system where the two MSB read thresholds have no constraints.

Figure 13A:
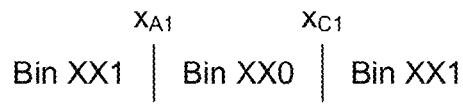
Figure 13A:
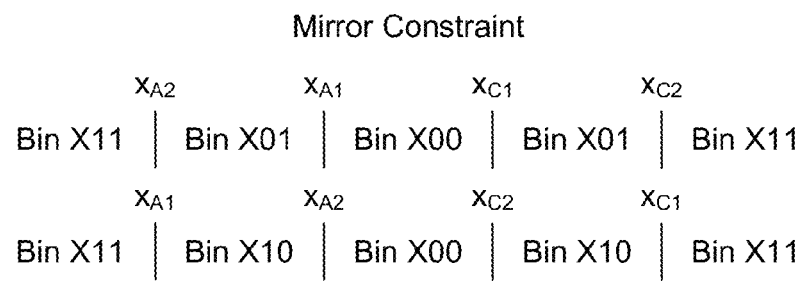
Figure 13A:
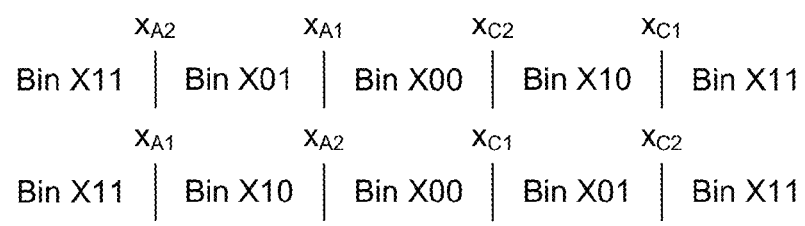

FIGS. 13A and 13B are diagrams illustrating an embodiment of three-bit, direct write bin labels for the MSB of an MLC system where the MSB read thresholds have no constraints. Diagram 1300 shows the direct write bin labels after one read. Diagram 1330 shows the possible direct write bin labels after two reads. The top two sets of bin labels in diagram 1330 show bin labels when the two MSB read thresholds are constrained to mirror each other. Note that the top set of bin labels in diagram 1330 are identical to the bin labels shown in diagram 1230 in FIG. 12.

The bottom two sets of bin labels in diagram 1330 show the bin labels when the MSB read thresholds have no mirror constraint. In the first set of bin labels therein, the MSB read threshold A moves left (i.e., $x_{A2} < x_{A1}$), as does the MSB read threshold C (i.e., $x_{C2} < x_{C1}$). In the second set of bin labels therein, the MSB read threshold A moves right (i.e., $x_{A1} < x_{A2}$), as does the MSB read threshold C (i.e., $x_{C1} < x_{C2}$). Having both MSB read thresholds move left or right violates the mirror constraint.

Diagram 1360 shows direct write bin labels after three reads when the two MSB read thresholds have no mirror constraint. Because of space limitations, the direct write bin labels that result when a mirror constraint is in place are not shown in diagram 1260. The bin labels in diagram 1360, when combined with the bin labels in diagram 1260 in FIG. 12, show the entire set of possible direct write bin labels after three reads.

The following shows an accumulative bin label example for the most significant bit in an MLC system.

Figure 14:
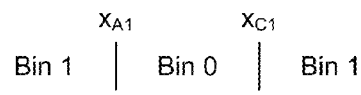
FIG. 14 is a diagram illustrating an embodiment of accumulative bin labels for the most significant bit in an MLC system.
Figure 14:
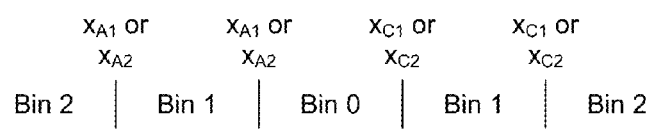
Figure 14:
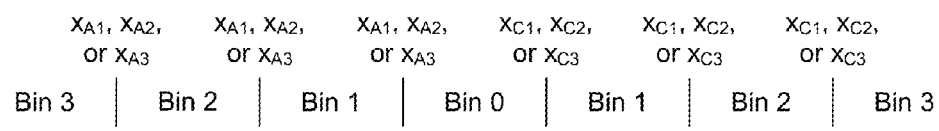

FIG. 14 is a diagram illustrating an embodiment of accumulative bin labels for the most significant bit in an MLC system. With accumulative bin labeling, the relationship between MSB read thresholds does not matter, so the same bin labels result when the two MSB read thresholds have a mirror constraint, as well as when the two MSB read thresholds have no mirror constraint. In the example shown, diagram 1400 shows accumulative bin labels for the MSB after one read, diagram 1430 shows accumulative bin labels for the MSB after two reads, and diagram 1460 shows accumulative bin labels for the MSB after three reads.

In some embodiments, there are a fixed number of bits for bin labeling and a read processor switches between a direct write bin labeling mode and an accumulative bin labeling mode in order to make the most of the fixed number of bits. Accumulative bin labeling permits cell and bin map information, associated with more reads, to fit into the same number of bits. This permits the system to perform more reads beyond the number of reads permitted given the fixed number of bits per bin label and the direct write format. The following figure shows an example of this.

Figure 15:
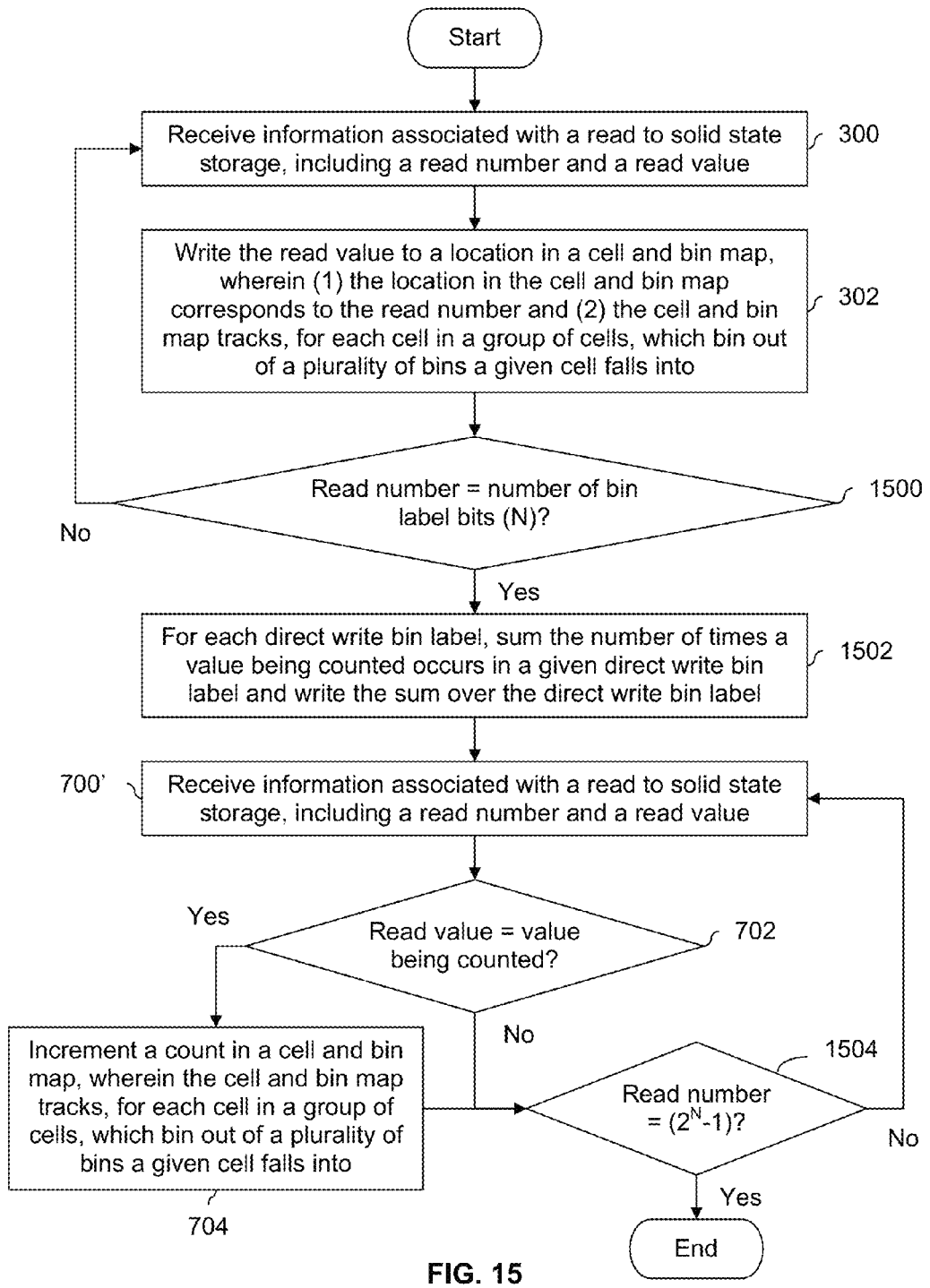
FIG. 15 is a flowchart illustrating an embodiment of a bin labeling process which begins in a direct write bin labeling mode and switches to an accumulative bin labeling mode.

FIG. 15 is a flowchart illustrating an embodiment of a bin labeling process which begins in a direct write bin labeling mode and switches to an accumulative bin labeling mode. In some embodiments, the process shown includes SLC embodiments where the cells store a single bit. In some embodiments, the process shown includes MLC embodiments where the cells store two bits. In some embodiments, map updater 210 in FIG. 2 performs the process shown. In some other systems, some other component may perform the process.

At 300, information associated with a read to solid state storage is received, including a read number and a read value. At 302, the read value is written to a location in a cell and bin map, wherein (1) the location in the cell and bin map corresponds to the read number and (2) the cell and bin map tracks, for each cell in a group of cells, which bin out of a plurality of bins a given cell falls into. Note that steps 300 and 302 in this figure match steps 300 and 302 in FIG. 3.

At 1500, it is determined if the read number matches the number of bin label bits (N). For example, suppose that three bits are allocated or available for each bin label. After the read values obtained at the third read have been written at 302, there are no more bits available for the next read if direct write formatting is used. As such, the system switches over to accumulative bin labeling mode. The check at 1500 will cause the process to pass through steps 300 and 302 multiple times for multiple reads until the number of bits available for bit labels is full.

At 1502, for each direct write bin label, the number of times a value being counted occurs in a given direct write bin label is summed and the sum is written over the direct write bin label. Step 1502 may depend upon how a cell and bin map is implemented. In one example implementation, each direct write bin label is followed by all cells that fall into that bin. Using diagram 550 in FIG. 5 as an example, for bin 1110 it would be (Bin 1110|Cell B (plus any other cells that fall in this bin)) and for bin 1100 it would be (Bin 1100|Cell C (plus any other cells that fall in this bin)). In that implementation, a given bin label only occurs once in the cell and bin map. If the value being counted is 1, then for a given bin label, the number of 1s is summed and that sum is written back to where the direct write bin label is stored. To continue the examples from above, (Bin 1110|Cell B (plus any other cells that fall in this bin)) would become (Bin 0011|Cell B (plus any other cells that fall in this bin)) and (Bin 1100|Cell C (plus any other cells that fall in this bin)) would become (Bin 0010|Cell C (plus any other cells that fall in this bin)).

In another example implementation, the cell and bin map comprises pairs where each pair comprises exactly one cell and one bin. In this implementation, a given direct write bin label can occur multiple times in the cell and bin map. For example, suppose there is another cell (Cell F) which also falls into bin 1111 in diagram 550 in FIG. 5. The cell and bin map would include the pair (Cell A, Bin 1111) as well as the pair (Cell F, Bin 1111). In that implementation, step 302 would transform (Cell A, Bin 1111) into (Cell A, Bin 0100) and (Cell F, Bin 1111) into (Cell F, Bin 0100).

At 700', information associated with a read to solid state storage is received, including a read number and a read value. Step 700' is one embodiment of step 700 in FIG. 7. Although a read number is not explicitly recited in step 700 in FIG. 7, step 700' further includes receiving a read number.

At 702, it is determined if the read value matches a value being counted. If so, a count in the cell and bin map is incremented, wherein the cell and bin map tracks, for each cell in a group of cells, which bin out of a plurality of bins a given cell falls into at 704. For brevity, in some cases, the explanation about what the cell and bin map does (i.e., it tracks, for each cell in a group of cells, which bin out of a plurality of bins a given cell falls) may be excluded since it is already recited in step 302.

After incrementing the count at 704 or if it is determined at 702 that the read value does not match the value being counted, it is determined at 1504 if the read number matches ($2^N-1$). The check at 1504 ensures that the bin labels in the accumulative format do not overflow the fixed number of bits allocated for bin labeling. If it is determined at 1504 that the read number does not match ($2^N-1$), then information associated with a read is received at 700'. If it is determined at 1504 that the read number does match ($2^N-1$) then the process ends. Naturally, the process shown may terminate at any time if error correction decoding is successful.

In some embodiments, soft read value generator 206 in FIG. 2 inputs a mode signal (e.g., 0=direct write bin labeling mode and 1=accumulative bin labeling mode). This permits the soft read value generator to know what format the bin labels are in and soft read value generator can change its processing accordingly so that LLR values are still properly generated even after the system switches over to the accumulative bin labeling mode. In the bin labeling mode, the cell and bin map information includes one or more direct write bin labels. In the accumulative bin labeling mode, the cell and bin map information includes one or more accumulative bin labels.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A system, comprising:
a map updater configured to:

receive information associated with a read to solid state storage, including a read number and a read value;

write the read value to a location in a cell and bin map, wherein (1) the location in the cell and bin map corresponds to the read number and (2) the cell and bin map tracks, for each cell in a group of cells, which bin out of a plurality of bins a given cell falls into;

determine if the read number matches a number of bits available for a direct write bin label; and in the event it is determined that the read number matches the number of bits, sum a number of times a value being counted occurs in the direct write bin label and write the sum over the direct write bin label; and a memory configured to store the cell and bin map.

2. The system of claim 1, wherein the map updater is implemented using a semiconductor device, including one or more of the following: an application-specific integrated circuit (ASIC) or a field-programmable gate array (FPGA).

3. The system of claim 1, wherein the solid state storage includes NAND Flash.

4. The system of claim 1, wherein the solid state storage includes one or more of the following: a single-level cell which is configured to store a single bit, a multi-level cell which is configured to store two bits, a triple-level cell (TLC) which is configured to store three bits, or a quad-level cell (QLC) which is configured to store four bits.

5. The system of claim 1, wherein:
the solid state storage includes a multi-level cell which is configured to store two bits; and
a first most significant bit (MSB) read threshold and a second MSB read threshold are constrained to mirror each other, such that one or more bin labels which result are symmetric.

6. The system of claim 1, wherein the map updater is further configured to:
determine if the read value matches a value being counted; and
in the event it is determined that the read value matches the value being counted, increment a count in the cell and bin map.

7. The system of claim 6 further comprising a soft read value generator, wherein the soft read value generator is configured to input: (1) a mode signal associated with indicating a direct write bin labeling mode and an accumulative bin labeling mode and (2) cell and bin map information which in the bin labeling mode includes one or more direct write bin labels and in the accumulative bin labeling mode includes one or more accumulative bin labels.

8. A system, comprising:
a map updater configured to:
receive information associated with a read to solid state storage, including a read value;
determine if the read value matches a value being counted; and
in the event it is determined that the read value matches the value being counted, increment a count in a cell and bin map, wherein the cell and bin map tracks, for each cell in a group of cells, which bin out of a plurality of bins a given cell falls into;
determine if the read number matches a number of bits available for a direct write bin label; and
in the event it is determined that the read number matches the number of bits, sum a number of times a value being counted occurs in the direct write bin label and write the sum over the direct write bin label; and
a memory configured to store the cell and bin map.

9. The system of claim 8, wherein the value being counted is a 1.

10. The system of claim 8, wherein the map updater is implemented using a semiconductor device, including one or more of the following: an application-specific integrated circuit (ASIC) or a field-programmable gate array (FPGA).

11. The system of claim 8, wherein the solid state storage includes NAND Flash.

12. The system of claim 8, wherein the solid state storage includes one or more of the following: a single-level cell which is configured to store a single bit, a multi-level cell which is configured to store two bits, a triple-level cell (TLC) which is configured to store three bits, or a quad-level cell (QLC) which is configured to store four bits.

13. The system of claim 8, wherein:
the solid state storage includes a multi-level cell which is configured to store two bits; and
a first most significant bit (MSB) read threshold and a second MSB read threshold are constrained to mirror each other, such that one or more bin labels which result are symmetric.

14. A method, comprising:
receiving information associated with a read to solid state storage, including a read number and a read value;
using a processor to write the read value to a location in a cell and bin map, wherein (1) the location in the cell and bin map corresponds to the read number and (2) the cell and bin map tracks, for each cell in a group of cells, which bin out of a plurality of bins a given cell falls into;
determining if the read number matches a number of bits available for a direct write bin label; and
in the event it is determined that the read number matches the number of bits, summing a number of times a value being counted occurs in the direct write bin label and writing the sum over the direct write bin label.

15. The method of claim 14, wherein the method is performed using a semiconductor device, including one or more of the following: an application-specific integrated circuit (ASIC) or a field-programmable gate array (FPGA).

16. The method of claim 14, wherein the solid state storage includes NAND Flash.

17. The method of claim 14, wherein the solid state storage includes one or more of the following: a single-level cell which is configured to store a single bit, a multi-level cell which is configured to store two bits, a triple-level cell (TLC) which is configured to store three bits, or a quad-level cell (QLC) which is configured to store four bits.

18. A method, comprising:
receiving information associated with a read to solid state storage, including a read value;
using a processor to determine if the read value matches a value being counted;
in the event it is determined that the read value matches the value being counted, using the processor to increment a count in a cell and bin map, wherein the cell and bin map tracks, for each cell in a group of cells, which bin out of a plurality of bins a given cell falls into;
determining if the read number matches a number of bits available for a direct write bin label; and
in the event it is determined that the read number matches the number of bits, summing a number of times a value being counted occurs in the direct write bin label and writing the sum over the direct write bin label.

19. The method of claim 18, wherein the method is performed using a semiconductor device, including one or more of the following: an application-specific integrated circuit (ASIC) or a field-programmable gate array (FPGA).

20. The method of claim 18, wherein the solid state storage includes NAND Flash.

21. The method of claim 18, wherein the solid state storage includes one or more of the following: a single-level cell which is configured to store a single bit, a multi-level cell which is configured to store two bits, a triple-level cell (TLC) which is configured to store three bits, or a quad-level cell (QLC) which is configured to store four bits.

* * * * *